(12) United States Patent
Murai et al.

(10) Patent No.: US 10,546,538 B2
(45) Date of Patent: Jan. 28, 2020

(54) DISPLAY APPARATUS AND METHOD OF DRIVING DISPLAY PANEL HAVING SELECTION PULSE FOR A SCANNING LEAD-OUT LINE BASED ON DISTANCE

(71) Applicant: JOLED INC., Tokyo (JP)

(72) Inventors: Atsuhito Murai, Tokyo (JP); Jiro Yamada, Tokyo (JP); Yasuhiro Terai, Tokyo (JP); Masahiko Kondo, Tokyo (JP); Noriteru Maeda, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/112,771

(22) Filed: Aug. 27, 2018

(65) Prior Publication Data

US 2019/0228711 A1 Jul. 25, 2019

(30) Foreign Application Priority Data

Jan. 19, 2018 (JP) ................................ 2018-007353

(51) Int. Cl.
*G09G 3/3266* (2016.01)
*G09G 3/36* (2006.01)
(Continued)

(52) U.S. Cl.
CPC ......... *G09G 3/3266* (2013.01); *G09G 3/3677* (2013.01); *G02F 1/136286* (2013.01);
(Continued)

(58) Field of Classification Search
CPC .. G09G 3/3266; G09G 3/3677; G09G 3/2096; G09G 2320/0223; G09G 2320/0233; G09G 2300/0426; G09G 2380/02; G09G 2310/067; G09G 2310/06; G09G 2310/066; G09G 2230/00;
(Continued)

(56) References Cited

U.S. PATENT DOCUMENTS

| 7,164,405 B1* | 1/2007 | Jeong | G09G 3/3688 345/94 |
| 2003/0048248 A1* | 3/2003 | Fukumoto | G09G 3/3688 345/89 |

(Continued)

FOREIGN PATENT DOCUMENTS

JP 2010-72363 A 4/2010

*Primary Examiner* — Darlene M Ritchie
(74) *Attorney, Agent, or Firm* — Hauptman Ham, LLP (57) ABSTRACT

A display apparatus includes a display panel and a driving circuit. The display panel includes signal lines extending in a column direction, scanning lines extending in a row direction, and lead-out lines extending in the column direction. Each of the lead-out lines intersects with corresponding one of the scanning lines at an intersection and is electrically coupled to the corresponding one of the scanning lines at a node. The node is disposed at the intersection or in a region surrounding the intersection. The driving circuit supplies corresponding one of the signal lines with a signal pulse corresponding to an image signal, and supplies corresponding one of the lead-out lines with a selection pulse having a peak value based on a distance from one end of the corresponding one of the lead-out lines to the corresponding node, after increasing the peak value with an increase in the distance.

11 Claims, 10 Drawing Sheets

(51) Int. Cl.
*G02F 1/1362* (2006.01)
*G09G 3/20* (2006.01)
*H05K 1/18* (2006.01)
*H01L 27/12* (2006.01)

(52) U.S. Cl.
CPC ... *G09G 3/2096* (2013.01); *G09G 2300/0426* (2013.01); *G09G 2310/067* (2013.01); *G09G 2320/0223* (2013.01); *G09G 2320/0233* (2013.01); *G09G 2380/02* (2013.01); *H01L 27/124* (2013.01); *H05K 1/189* (2013.01)

(58) Field of Classification Search
CPC ......... G02F 1/133308; G02F 1/133388; G02F 1/136286; G02F 2001/13629
See application file for complete search history.

(56) References Cited

U.S. PATENT DOCUMENTS

| | | | | |
|---|---|---|---|---|
| 2006/0145991 | A1* | 7/2006 | Jang | G09G 3/3677 345/94 |
| 2007/0273683 | A1* | 11/2007 | Yamada | G02F 1/136213 345/212 |
| 2010/0066967 | A1* | 3/2010 | Takahashi | G02F 1/1345 349/143 |
| 2010/0194735 | A1* | 8/2010 | Ohtsubo | G09G 3/3666 345/211 |
| 2011/0043711 | A1* | 2/2011 | Tsuda | G09G 3/3688 348/790 |
| 2011/0102384 | A1* | 5/2011 | Huang | G09G 3/3648 345/204 |
| 2012/0287092 | A1* | 11/2012 | Tatara | G09G 3/3233 345/204 |
| 2013/0107152 | A1* | 5/2013 | Okumura | G09G 3/3677 349/41 |
| 2013/0141660 | A1* | 6/2013 | Wang | G02F 1/136286 349/43 |
| 2017/0003541 | A1* | 1/2017 | Xu | G02F 1/13454 |
| 2017/0031223 | A1* | 2/2017 | Xue | G02F 1/13454 |
| 2017/0115543 | A1* | 4/2017 | Zou | G02F 1/133345 |
| 2018/0196295 | A1* | 7/2018 | Xing | G02F 1/1345 |
| 2018/0284551 | A1* | 10/2018 | Shim | G09G 3/3266 |
| 2018/0315369 | A1* | 11/2018 | Pyun | G09G 3/2092 |
| 2019/0025660 | A1* | 1/2019 | Shimoshikiryoh | G02F 1/1333 |
| 2019/0114981 | A1* | 4/2019 | Yoshida | G09G 3/3648 |

* cited by examiner

DISPLAY APPARATUS AND METHOD OF DRIVING DISPLAY PANEL HAVING SELECTION PULSE FOR A SCANNING LEAD-OUT LINE BASED ON DISTANCE

CROSS REFERENCE TO RELATED APPLICATIONS

This application claims the benefit of Japanese Priority Patent Application No. 2018-007353 filed on Jan. 19, 2018, the entire contents of which are incorporated herein by reference.

BACKGROUND

The disclosure relates to a display apparatus and a method of driving a display panel.

Having a narrow bezel is advantageous for a display apparatus in terms of design. A technology for a display apparatus with a narrow bezel is disclosed in Japanese Unexamined Patent Application Publication No. 2010-72363, for example.

SUMMARY

Unfortunately, the display apparatus disclosed in Japanese Unexamined Patent Application Publication No. 2010-72363 may possibly cause different transient signal waveforms due to wiring lines having resistor-capacitor (RC) time constants greatly different from one another. This may possibly cause a display defect such as unevenness in luminance.

It is desired to provide a display apparatus and a method of driving a display panel that are able to reduce a display defect due to a reduction in a bezel width.

A display apparatus according to one embodiment of the disclosure includes a display panel and a driving circuit configured to drive the display panel. The display panel includes a plurality of pixels disposed in matrix, a plurality of signal lines extending in a column direction, a plurality of scanning lines extending in a row direction, and a plurality of lead-out lines extending in the column direction. Each of the lead-out lines intersects with corresponding one of the scanning lines at an intersection and is electrically coupled to the corresponding one of the scanning lines at a node. The node is disposed at the intersection or in a region surrounding the intersection. The driving circuit is configured to supply corresponding one of the signal lines with a signal pulse corresponding to an image signal, and supply corresponding one of the lead-out lines with a selection pulse having a peak value based on a distance from one end of the corresponding one of the lead-out lines to the corresponding node, after increasing the peak value with an increase in the distance. The selection pulse is directed to selection of the pixels.

A method of driving a display panel according to one embodiment of the disclosure includes: preparing a display panel that includes a plurality of pixels disposed in matrix, a plurality of signal lines extending in a column direction, a plurality of scanning lines extending in a row direction, and a plurality of lead-out lines extending in the column direction, in which each of the lead-out lines intersects with corresponding one of the scanning lines at an intersection and is electrically coupled to the corresponding one of the scanning lines at a node, and the node is disposed at the intersection or in a region surrounding the intersection; supplying corresponding one of the signal lines with a signal pulse corresponding to an image signal; and supplying corresponding one of the lead-out lines with a selection pulse having a peak value based on a distance from one end of the corresponding one of the lead-out lines to the corresponding node, after increasing the peak value with an increase in the distance, in which the selection pulse is directed to selection of the pixels.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

FIG. 7A and FIG. 7B illustrate example selection pulses and signal pulses, in which

FIG. 9A and FIG. 9B illustrate example selection pulses and signal pulses, in which

FIG. 10A and FIG. 10B illustrate example selection pulses and signal pulses, in which

DETAILED DESCRIPTION

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. Embodiments
2. Modification Examples
3. Application Examples

1. Embodiments

[Configuration]

Figure 1:
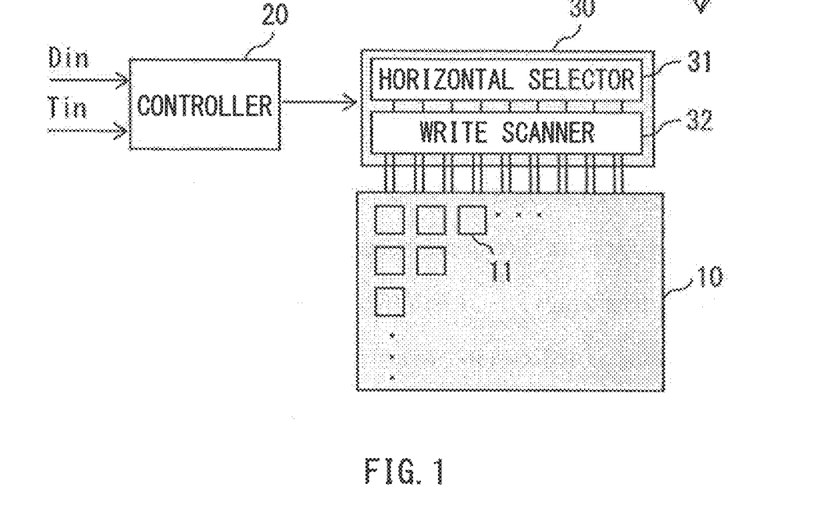
FIG. 1 is a schematic view of a display apparatus having an example configuration according to one embodiment of the disclosure.
Figure 2:
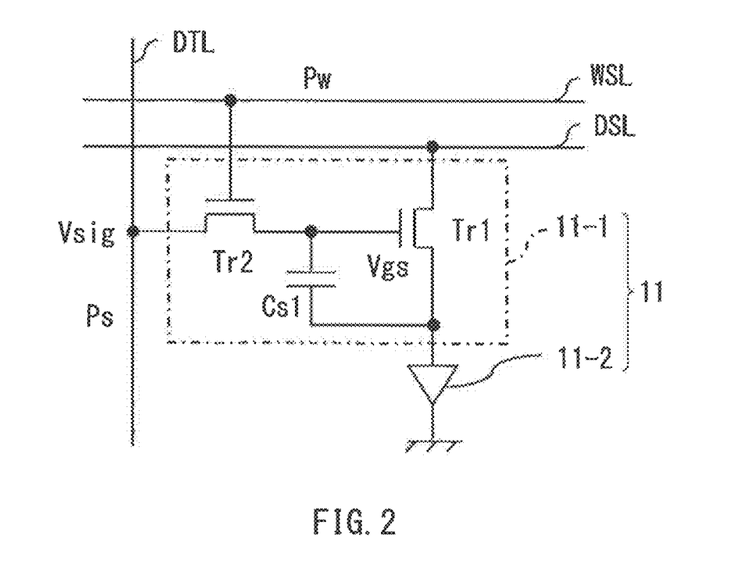
FIG. 2 is an example circuit diagram of each pixel according to one embodiment of the disclosure.
Figure 3:
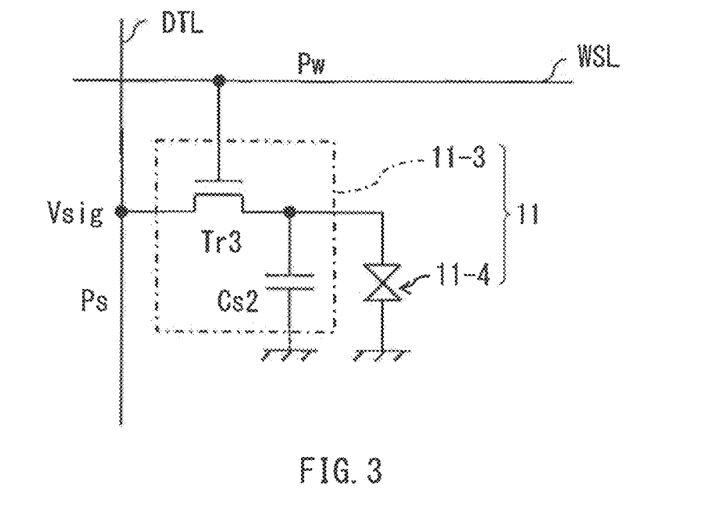
FIG. 3 is an example circuit diagram of each pixel according to one embodiment of the disclosure.

FIG. 1 is a schematic view of a display apparatus having an example configuration according to an example embodiment of the disclosure. FIGS. 2 and 3 are example circuit diagrams of each pixel 11 in the display apparatus 1. The display apparatus 1 includes, for example, a display panel 10, a controller 20, and a driver 30. A combination of the controller 20 and the driver 30 may correspond to a specific but non-limiting example of a "driving circuit" according to one embodiment of the disclosure. The driver 30 may be mounted on an outer edge region of the display panel 10, for example. The display panel 10 includes a plurality of pixels 11 disposed in matrix. The controller 20 and the driver 30 may drive the display panel 10 (i.e., pixels 11) on the basis of an external image signal Din and an external synchronizing signal Tin.

[Display Panel 10]

In response to the active-matrix driving of the pixels 11 performed by the controller 20 and the driver 30, the display panel 10 may display an image based on the external image signal Din and the external synchronizing signal Tin.

In an example embodiment where the display panel 10 is an organic electroluminescent panel, the display panel 10 includes a plurality of scanning lines WSL extending in a row direction, a plurality of power lines DSL extending in the row direction, a plurality of signal lines DTL extending in a column direction, and the plurality of pixels 11 disposed in a matrix, as illustrated in FIGS. 1 and 2, for example.

The scanning lines WSL are used to select the pixels 11. In an example embodiment of the disclosure, the scanning lines WSL supply the respective pixels 11 with a selection pulse Pw to select the pixels 11 on a predetermined unit basis, for example, a pixel-row basis. The signal lines DTL are used to supply the respective pixels 11 with a signal pulse Ps of which peak value is a signal voltage Vsig corresponding to the image signal Din. The signal lines DTL may be coupled to an output end of a horizontal selector 31 described below. The power lines DSL may be used to supply the respective pixels 11 with electric power.

The pixels 11 may each include a sub-pixel emitting red light, a sub-pixel emitting green light, and a sub-pixel emitting blue light, for example. Optionally, each pixel 11 may further include a sub-pixel emitting light in another color, such as white or yellow, for example. The sub-pixels in each pixel 11 may be aligned in line in a predetermined direction, for example.

The signal lines DTL may be coupled to an output end of a horizontal selector 31 described below. Each of the signal lines DTL is provided for corresponding one of pixel columns, for example. The scanning lines WSL may be coupled to an output end of a write scanner 32 described below. Each of the scanning lines WSL is provided for corresponding one of pixel rows, for example. The power lines DSL may be coupled to an output end of a power source. Each of the power lines DSL is provided for corresponding one of the pixel rows.

The pixels 11 may each include a pixel circuit 11-1 and an organic electroluminescent element 11-2, for example. The organic electroluminescent element 11-2 may emit electroluminescent (EL) light having a predetermined wavelength in response to a current fed therein.

The pixel circuit 11-1 may control light emission and light extinction of the organic electroluminescent element 11-2. The pixel circuit 11-1 may hold a voltage written into the corresponding pixel 11 through write scanning described below. The pixel circuit 11-1 may include a driving transistor Tr1, a switching transistor Tr2, and a storage capacitor Cs1, for example.

The switching transistor Tr2 may control application of the signal voltage Vsig to a gate of the driving transistor Tr1. The signal voltage Vsig may correspond to the image signal Din. For example, the switching transistor Tr2 may sample a voltage of the corresponding signal line DTL and write the sampled voltage into the gate of the driving transistor Tr1. The driving transistor Tr1 may be coupled in series to the organic electroluminescent element 11-2. The driving transistor Tr1 may drive the organic electroluminescent element 11-2. The driving transistor Tr1 may control a driving current flowing in the organic electroluminescent element 11-2 on the basis of the magnitude of the voltage sampled at the switching transistor Tr2. The storage capacitor Cs1 may hold a predetermined voltage between the gate and a source of the driving transistor Tr1. The storage capacitor Cs1 may hold a gate-source voltage Vgs of the driving transistor Tr1 at a constant level for a predetermined period. Note that the pixel circuit 11-1 may have a circuit configuration that includes the 2Tr1C circuit described above and additional capacitors and transistors. Alternatively, the pixel circuit 11-1 may have a circuit configuration different from that of the 2Tr1C circuit described above.

Each of the signal lines DTL may be coupled to an output end of the horizontal selector 31 described below and a source or a drain of the corresponding switching transistor Tr2. Each of the scanning lines WSL may be coupled to an output end of the write scanner 32 described below and a gate of the corresponding switching transistor Tr2. Each of the power lines DSL may be coupled to a power supply circuit and the source or a drain of the corresponding driving transistor Tr1.

The gate of the corresponding switching transistor Tr2 may be coupled to the corresponding scanning line WSL. One of the source or drain of the corresponding switching transistor Tr2 may be coupled to the corresponding signal line DTL. The other of the source or drain, which is not coupled to the corresponding signal line DTL, of the corresponding switching transistor Tr2 may be coupled to the gate of the corresponding driving transistor Tr1. One of the source or drain of the corresponding driving transistor Tr1 may be coupled to the corresponding power line DSL. The other of the source or drain, which is not coupled to the corresponding power line DSL, of the corresponding driving transistor Tr1 may be coupled to an anode of the corresponding organic electroluminescent element 11-2. One end of the corresponding storage capacitor Cs1 may be coupled to the gate of the corresponding driving transistor Tr1. The other end of the corresponding storage capacitor Cs1 may be coupled to one of the source or drain, which is adjacent to the corresponding organic electroluminescent element 11-2, of the corresponding driving transistor Tr1.

In an example embodiment where the display panel 10 is a liquid crystal panel, the display panel 10 includes the plurality of scanning lines WSL extending in the row direction, the plurality of signal lines DTL extending in the column direction, and the plurality of pixels 11 disposed in a matrix, as illustrated in FIGS. 1 and 3, for example. The display panel 10 may further include a backlight that supplies light to the pixels 11, for example.

The scanning lines WSL are used to select the pixels 11. In an example embodiment of the disclosure, the scanning lines WSL supply the respective pixels 11 with the selection pulse Pw to select the pixels 11 on a predetermined unit basis, for example, a pixel-row basis. The signal lines DTL are used to supply the respective pixels 11 with the signal pulse Ps of which peak value is the signal voltage Vsig corresponding to the image signal Din.

The pixels 11 may each include a sub-pixel emitting red light, a sub-pixel emitting green light, and a sub-pixel emitting blue light, for example. Optionally, each pixel 11 may further include a sub-pixel emitting light in another color, such as white or yellow, for example. The sub-pixels in each pixel 11 may be aligned in line in a predetermined direction, for example.

The signal lines DTL may be coupled to the output end of the horizontal selector 31 described below. Each of the signal lines DTL is provided for corresponding one of the pixel columns, for example. The scanning lines WSL may be coupled to the output end of the write scanner 32 described below. Each of the scanning lines WSL is provided for corresponding one of the pixel rows, for example.

The pixels 11 may each include a pixel circuit 11-3 and a liquid crystal cell 11-4, for example. The liquid crystal cell 11-4 may transmit and block the light from the backlight in response to a voltage applied thereto.

The pixel circuit 11-3 may control the light transmission and light blocking of the liquid crystal cell 11-4. The pixel circuit 11-3 may hold a voltage written into the corresponding pixel 11 through write scanning described below. The pixel circuit 11-3 may include a switching transistor Tr3 and a storage capacitor Cs2, for example.

The switching transistor Tr3 may control application of the signal voltage Vsig to the liquid crystal cell 11-4. The signal voltage Vsig may correspond to the image signal Din. For example, the switching transistor Tr3 may sample a voltage of the corresponding signal line DTL and write the sampled voltage into the liquid crystal cell 11-4. The storage capacitor Cs2 may hold a predetermined voltage applied to the liquid crystal cell 11-4. The storage capacitor Cs2 may hold a voltage of the liquid crystal cell 11-4 at a constant level for a predetermined period. Note that the pixel circuit 11-3 may have a circuit configuration that includes the 2Tr1C circuit described above and additional capacitors and transistors. Alternatively, the pixel circuit 11-13 may have a circuit configuration different from that of the 2Tr1C circuit described above.

Each of the signal lines DTL may be coupled to the output end of the horizontal selector 31 described below and the source or drain of the corresponding switching transistor Tr3. Each of the scanning lines WSL may be coupled to the output end of the write scanner 32 described below and a gate of the corresponding switching transistor Tr3.

The gate of the corresponding switching transistor Tr3 may be coupled to the corresponding scanning line WSL. One of the source or drain of the corresponding switching transistor Tr3 may be coupled to the corresponding signal line DTL. The other of the source or drain, which is not coupled to the corresponding signal line DTL, of the corresponding switching transistor Tr3 may be coupled to the corresponding liquid crystal cell 11-4. One end of the corresponding storage capacitor Cs2 may be coupled to the corresponding liquid crystal cell 11-4.

[Driver 30]

The driver 30 may include the horizontal selector 31 and the write scanner 32, for example. The horizontal selector 31 may apply an analog signal voltage Vsig received from the controller 20 to the signal lines DTL, in response to or in synchronization with a control signal, for example. The write scanner 32 may scan the pixels 11 on a predetermined unit basis.

[Controller 20]

The controller 20 will now be described. The controller 20 may perform a predetermined correction on a digital image signal Din received from an external device, for example, and generate the signal voltage Vsig corresponding to the corrected image signal. The controller 20 may output the generated signal voltage Vsig to the horizontal selector 31, for example. The controller 20 may output a control signal to the circuitry in the driver 30 in response to or in synchronization with the synchronizing signal Tin received from an external device, for example.

Figure 4:
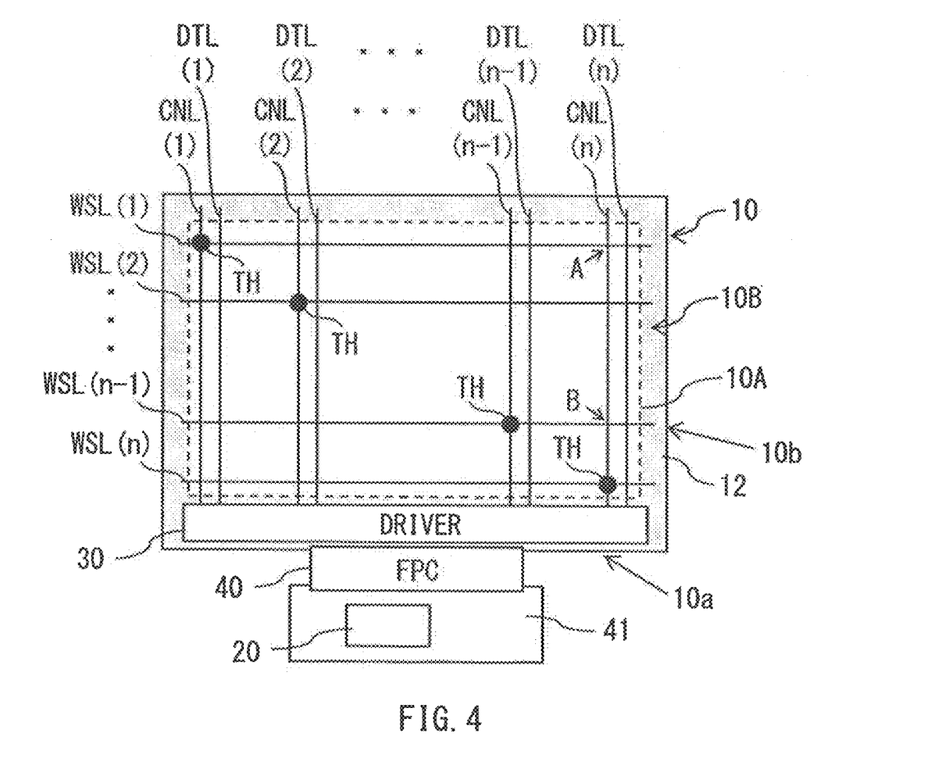
FIG. 4 is a schematic view of a display panel having an example configuration according to one embodiment of the disclosure.

FIG. 4 is a schematic view of the display panel having an example configuration according to an example embodiment of the disclosure. As described above, the display panel 10 includes the plurality of signal lines DTL extending in the column direction, the plurality of scanning lines WSL extending in the row direction, and a plurality of lead-out lines CNL extending in the column direction. Each of the lead-out lines CNL intersects with corresponding one of the scanning lines WSL at an intersection and is electrically coupled to the corresponding one of the scanning line WSL at a through-hole TH of the display panel 10. The through-hole TH is disposed at the intersection or in a region surrounding the intersection. The through-hole TH may be a specific but non-limiting example of a "node" according to one embodiment of the disclosure.

In an example embodiment of the disclosure, the lead-out lines CNL may be different from one another in a distance from one end of corresponding one of the lead-out lines CNL to the corresponding node (i.e., the corresponding through-hole TH). The distance may decrease in the order of CNL(1), CNL(2), CNL(n−1), and CNL(n), for example. Accordingly, with reference to FIG. 4, the distance from the write scanner 32 to a position A through which the selection pulse Pw travels may differ from the distance from the write scanner 32 to a position B through which the selection pulse Pw travels. For example, the distance from the write scanner 32 to the position A through which the selection pulse Pw travels may be longer than the distance from the write scanner 32 to the position B through which the selection pulse Pw travels.

The display panel 10 may include a substrate 12 that support the pixels 11, the signal lines DTL, the scanning lines WSL, and the lead-out lines CNL. For example, the substrate 12 may be a light-transmissive substrate including a light-transmissive resin, for example. The substrate 12 may be a bendable and flexible substrate, for example. The substrate 12 may have a rectangular shape, for example. Alternatively, the substrate 12 may have another shape, such as a trapezoidal, elliptical, or circular shape.

Figure 5:
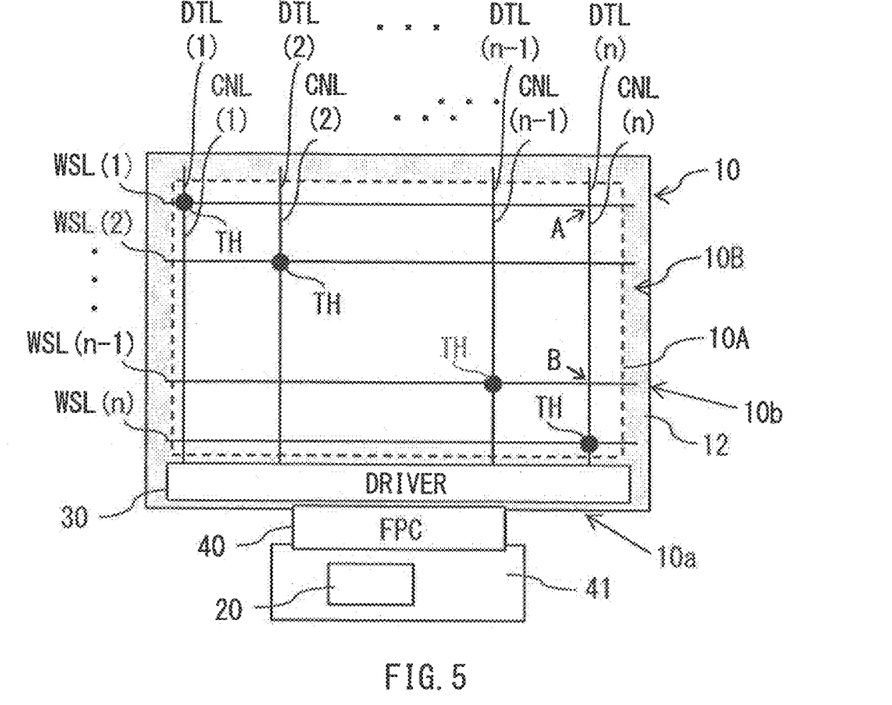
FIG. 5 is a schematic view of the display panel having an example configuration according to one modification of the disclosure.

In an example embodiment, each of the lead-out lines CNL may be disposed closer to the corresponding one of the signal lines DTL than any other one of the lead-out lines CNL. For example, with reference to FIG. 5, each lead-out line CNL and the corresponding signal line DTL may partially or entirely overlap one another, when seen from the normal direction of the substrate 12.

The substrate 12 may have a first outer edge region extending along a first side 10a in the row direction and three second outer edge regions extending along respective second sides 10b. The width of the first outer edge region is greater than the width of each of the second outer edge regions.

One example reason for the display panel 10 having such a configuration is that the driver 30 may be mounted adjacent to the first side 10a. Another reason for the display panel 10 having such a configuration is that the display panel 10 may further include a flexible printed circuit (FPC) board 40 disposed adjacent to the first side 10a. The FPC board 40 may electrically couple the signal lines DTL and the lead-out lines to the controller 20 or electrically couple the driver 30 to the controller 20. The controller 20 may correspond to a specific but non-limiting example of an "external circuit" according to one embodiment of the disclosure. The FPC board 40 may be coupled to the vicinity of the first side 10a and a control board 41 on which the controller 20 is mounted, for example.

Figure 6:
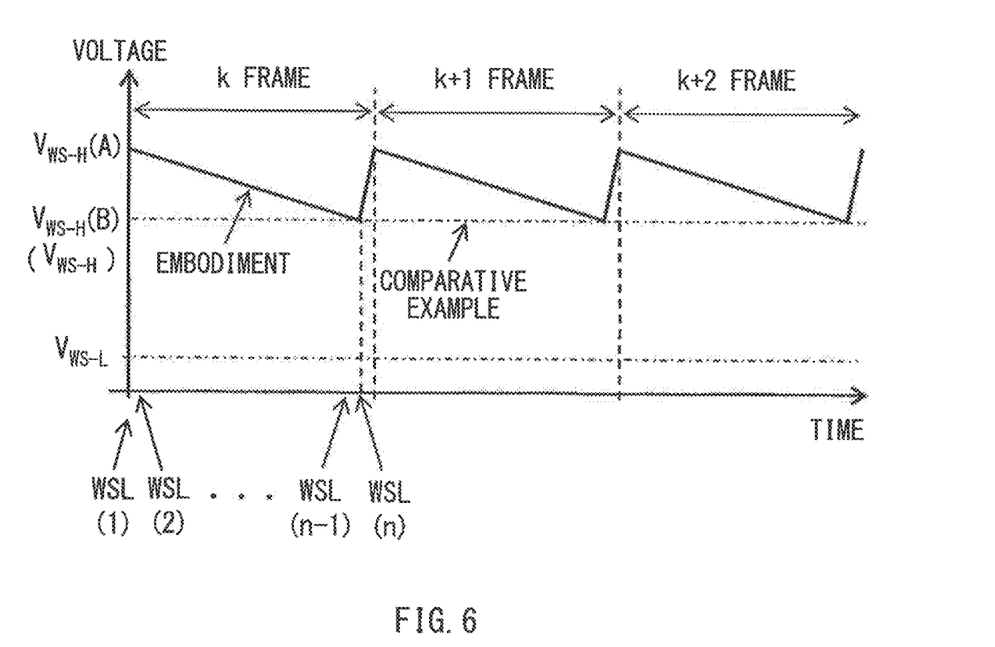
FIG. 6 is a chart illustrating an example temporal variation of a peak value of a selection pulse applied to lead-out lines according to one embodiment of the disclosure.
Figure 7A:
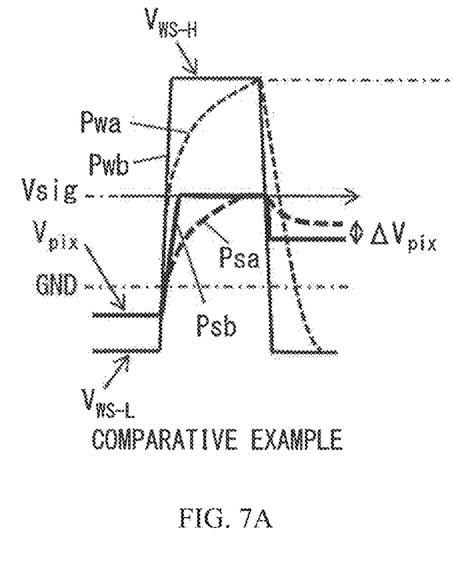
FIG. 7A is an example diagram of a selection pulse and a signal pulse according to a comparative example.
Figure 7B:
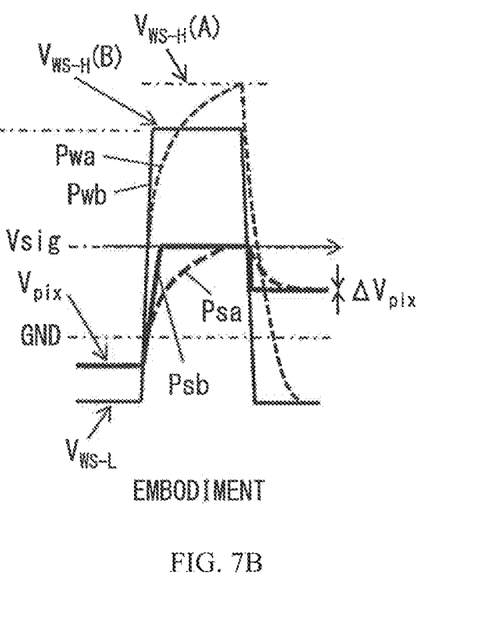
FIG. 7B is an example diagram of a selection pulse and a signal pulse according to one embodiment of the disclosure.
Figure 8:
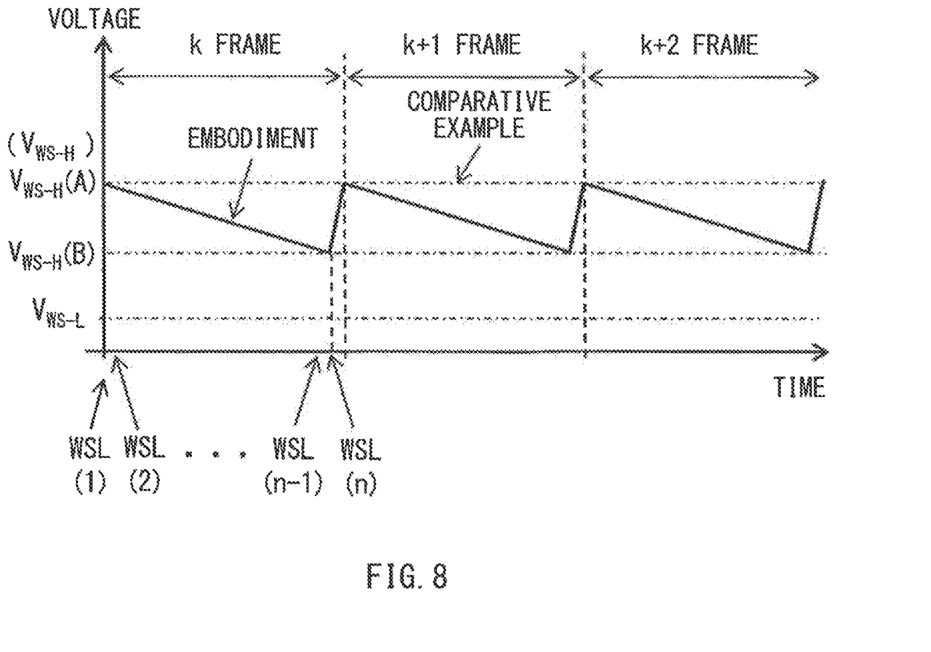
FIG. 8 is a chart illustrating another example temporal variation of a peak value of a selection pulse applied to lead-out lines according to one embodiment of the disclosure.
Figure 9A:
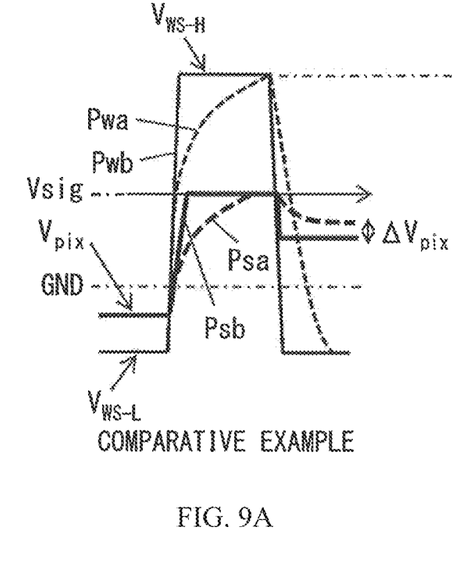
FIG. 9A is an example diagram of a selection pulse and a signal pulse according to a comparative example.
Figure 9B:
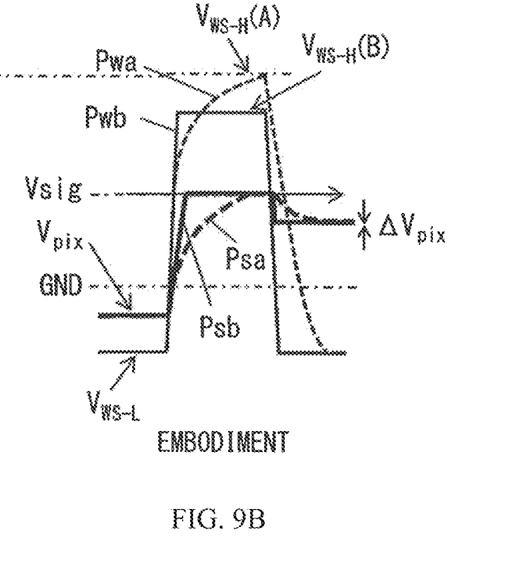
FIG. 9B is an example diagram of a selection pulse and a signal pulse according to one embodiment of the disclosure.

FIGS. 6 and 8 are charts each illustrating an example temporal variation of the peak value of the selection pulse Pw applied to the lead-out lines CNL. FIG. 7A and FIG. 9A are example diagrams of a selection pulse Pw and a signal pulse Ps according to a comparative example. FIG. 7B and FIG. 9B are example diagrams of the selection pulse Pw and signal pulse Ps according to an example embodiment of the disclosure. In FIG. 7B and FIG. 9B, Pwa represents the selection pulse Pw applied to the position A, Psa represents the signal pulse Ps applied to the position A, $V_{WS-H(A)}$ represents the peak value of the selection pulse Pw applied to the position A, Pwb represents the selection pulse Pw applied to the position B, Psb represents the signal pulse Ps applied to the position B, and $V_{WS-H(B)}$ represents the peak value of the selection pulse Pw applied to the position B.

With reference to FIG. 6, FIG. 7A and FIG. 7B, the peak value $V_{WS-H(B)}$ of the selection pulse Pw at the position B is equal to the peak value $V_{WS-H}$ of the selection pulse Pw of the comparative example. In FIG. 8, FIG. 9A and FIG. 9B, the peak value $V_{WS-H(A)}$ of the selection pulse Pw at the position A is equal to the peak value $V_{WS-H}$ of the selection pulse Pw according to the comparative example. The peak value $V_{WS-H}$ of the selection pulse Pw (Pwa, Pwb) according to the comparative example is a fixed value.

With reference to FIGS. 6 and 8, for example, the write scanner 32 supplies corresponding one the lead-out lines CNL with the selection pulse Pw having a peak value based on the distance from one end of the corresponding lead-out line CNL to the corresponding node (i.e., the through-hole TH), after increasing the peak value with an increase in the distance. In an example embodiment of the disclosure, as illustrated in FIG. 7B and FIG. 9B, for example, the write scanner 32 supplies the corresponding one of the lead-out lines CNL with the selection pulse Pw having a rounded waveform based on the distance, after increasing the rounding of the selection pulse Pw with an increase in the distance. This suppresses a variation in the signal voltage Vsig (ΔVpix) applied to the pixels 11 when the signal pulse Ps corresponding to a common image signal Din is applied to the pixels 11.

[Effects]

Some effects of the display apparatus 1 and the method of driving the display panel 10 according to any embodiment of the disclosure will now be described.

Having a narrow bezel is advantageous for a display apparatus in terms of design. Unfortunately, a typical display apparatus and a typical method of driving a display panel may possibly cause different transient signal waveforms due to wiring lines having RC time constants greatly different from one another. This may possibly cause a display defect such as unevenness in luminance.

In contrast, in the display apparatus 1 and the method of driving the display panel 10 each according to any embodiment of the disclosure, the signal pulse Ps corresponding to the image signal Din is supplied to corresponding one of the signal lines DTL, and the selection pulse directed to selection of the pixels 11 is supplied to the corresponding one of the lead-out lines CNL. The selection pulse supplied to the corresponding one of the lead-out lines CNL has the peak value based on the distance from one end of the corresponding one of the lead-out lines CNL to the corresponding node (i.e., the corresponding through-hole TH). The peak value of the selection pulse Pw is increased with an increase in the distance. This suppresses a variation in the signal voltage Vsig (ΔVpix) applied to the pixels 11 when the signal pulse Ps corresponding to a common image signal Din is applied to the pixels 11, suppressing a display defect such as unevenness in luminance. Accordingly, it is possible to reduce a display defect due to a reduction in the bezel width.

2. Modification Examples

Modification Example A

Figure 10A:
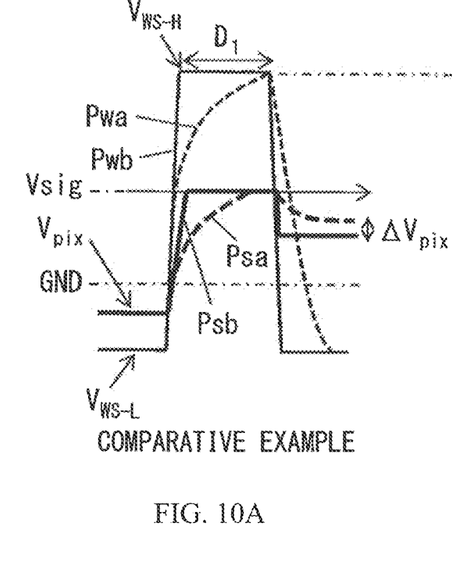
FIG. 10A is an example diagram of a selection pulse and a signal pulse according to a comparative example.
Figure 10B:
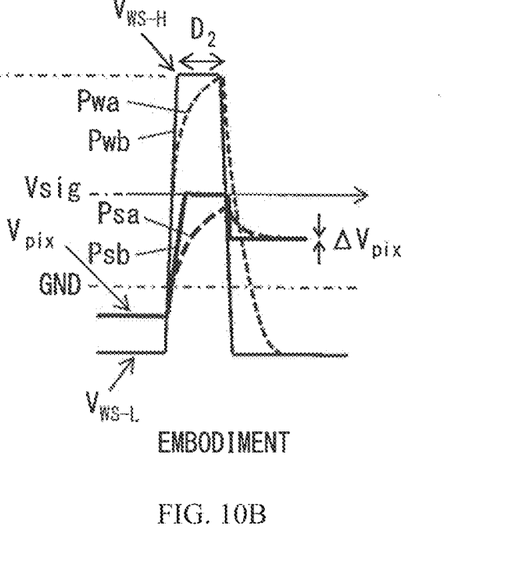
FIG. 10B is an example diagram of a selection pulse and a signal pulse according to one modification of the disclosure.

In any embodiment of the disclosure, the write scanner 32 may supply corresponding one of the lead-out lines CNL with the selection pulse Pw having a pulse width D based on the distance from one end of the corresponding one of the lead-out lines CNL to the corresponding through-hole TH, as illustrated in FIG. 10A and FIG. 10B, for example. $D_1$ represents a pulse width of the selection pulse Pw of the comparative example, and $D_2$ represents a pulse width of the selection pulse Pw of the modification of the disclosure. The write scanner 32 may decrease the pulse width $D_2$ with an increase in the distance. In this modification, the write scanner 32 may change the width of the selection pulse Pw instead of the peak value of the selection pulse Pw. In other words, the write scanner 32 may output the selection pulse Pw having a peak value which is constant regardless of the distance described above. This also suppresses a variation in the signal voltage Vsig (ΔVpix) applied to the pixels 11 when the signal pulse Ps corresponding to a common image signal Din is applied to the pixels 11, suppressing a display defect such as unevenness in luminance. Accordingly, it is possible to reduce a display defect due to a reduction in the bezel width.

Modification Example B

Figure 11:
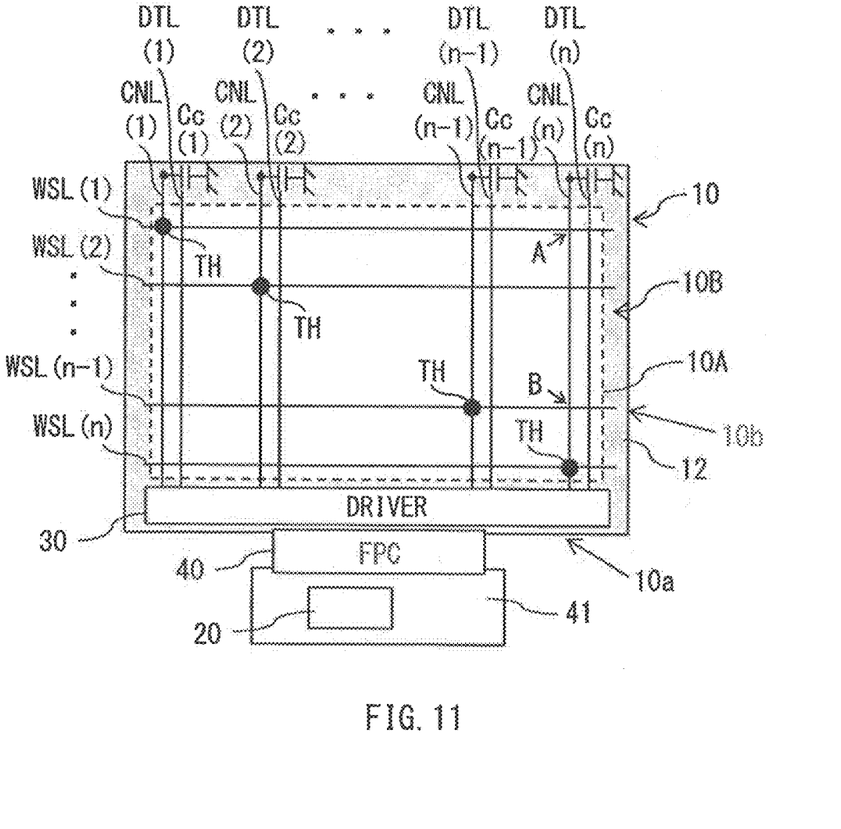
FIG. 11 is a schematic view of a display panel having an example configuration according to one modification of the disclosure.

In any embodiment and modification of the disclosure, the display panel 10 may further include additional capacitors Cc each coupled to the corresponding one of the lead-out lines CNL, as illustrated in FIG. 11, for example. In this modification, the the capacitors Cc may each have a capacitance that is increased with an increase in the corresponding distance from one end of the corresponding one of the lead-out lines CNL to the corresponding through-hole TH. This causes the RC time constant of the lead-out line CNL to be dominant. Accordingly, when the signal pulse Ps corresponding to a common image signal Din is applied to the pixels 11, a variation in the signal voltage Vsig ($\Delta$Vpix) applied to the pixels 11 is suppressed by increasing the peak value of the selection pulse Pw with an increase in the distance described above. As a result, a display defect such as unevenness in luminance is suppressed. Accordingly, it is possible to reduce a display defect due to a reduction in the bezel width.

Modification Example C

Figure 12:
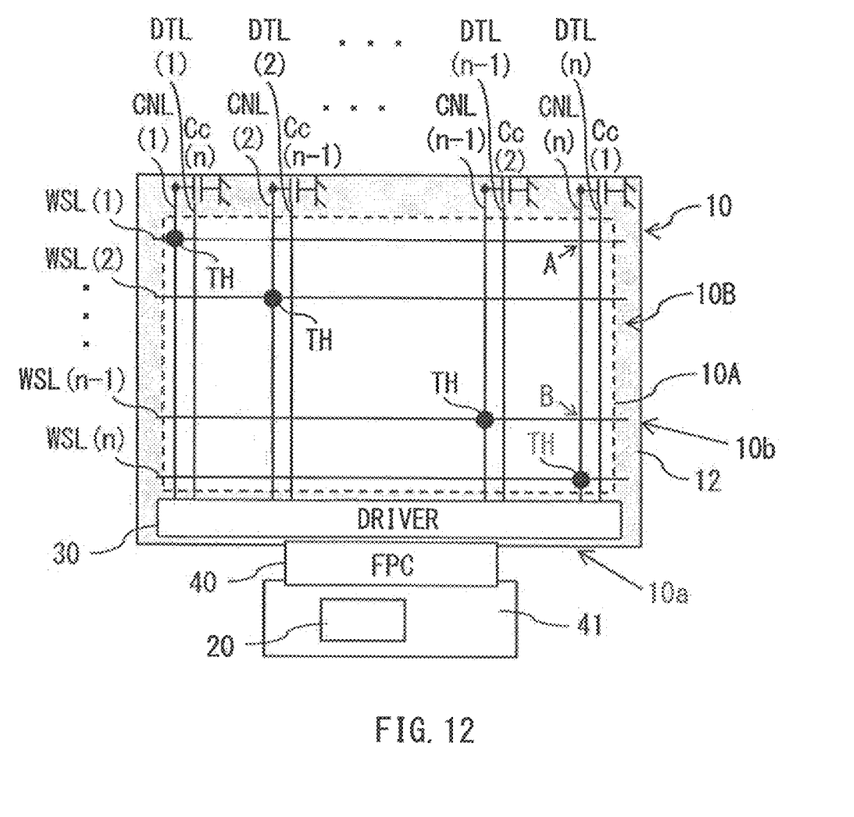
FIG. 12 is a schematic view of a display panel having an example configuration according to one modification of the disclosure.

In any embodiment and modification of the disclosure, each of the capacitors Cc may have a capacitance that is decreased with an increase in the corresponding distance from one end of the corresponding one of the lead-out lines CNL to the corresponding through-hole TH, as illustrated in FIG. 12, for example. This uniformizes the RC time constants of the wiring lines. Accordingly, a variation in the signal voltage Vsig ($\Delta$Vpix) applied to the pixels 11 is suppressed simply by maintaining the peak value of the selection pulse at a constant value regardless of the distance described above, rather than increasing the peak value with an increase in the distance described above. As a result, a display defect such as unevenness in luminance is suppressed. Accordingly, it is possible to reduce a display defect due to a reduction in the bezel width.

Modification Example D

Figure 13:
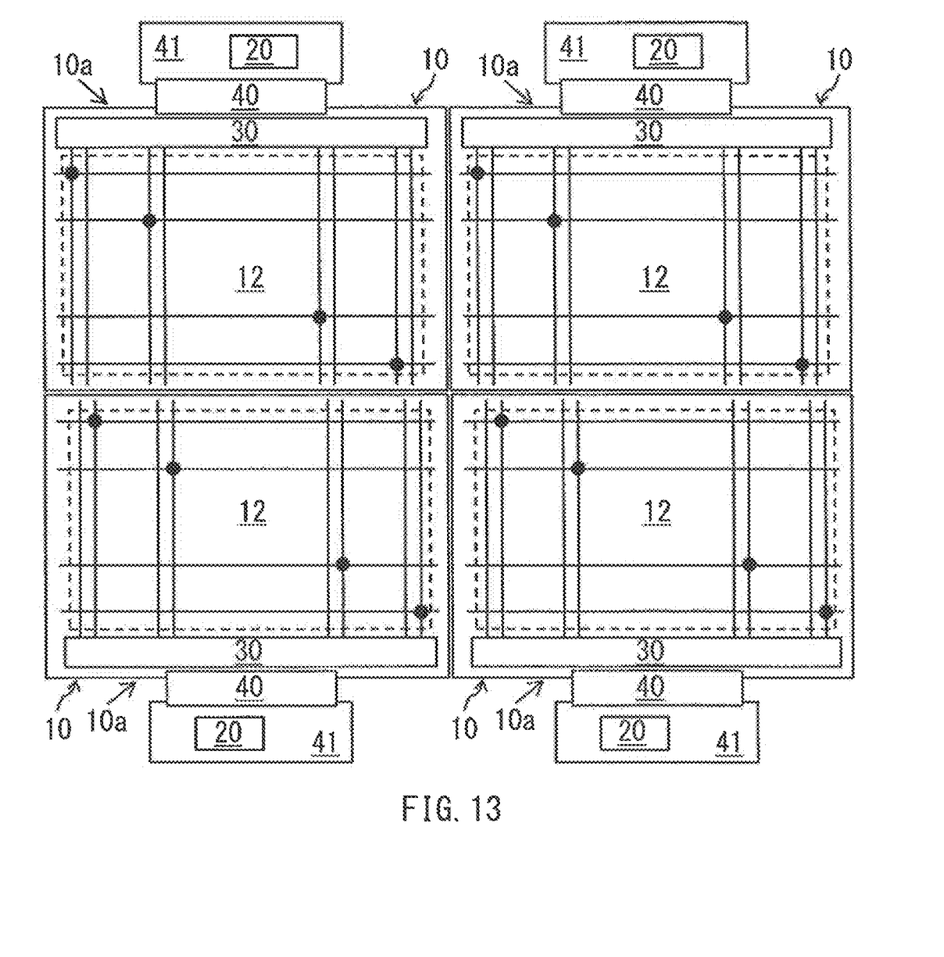
FIG. 13 is a top view of display panels according to one embodiment of the disclosure that are disposed in a tiled form.

In any embodiment and modification of the disclosure, several display panels 10 may be disposed into a tiled display, as illustrated in FIG. 13, for example. In this modification, the first sides 10a of the display panels 10 may define outer edges of the tiled display, for example.

Modification Example E

Figure 14:
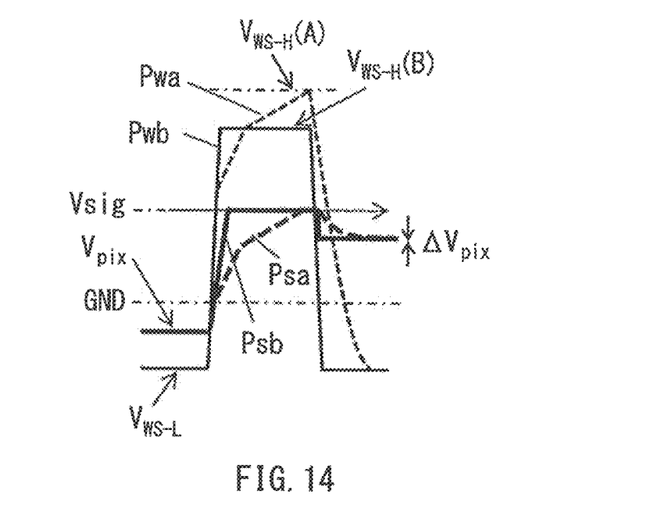
FIG. 14 is an example diagram of a selection pulse and a signal pulse according to one modification of the disclosure.

In any embodiment and modification of the disclosure, as illustrated in FIG. 14, for example, the write scanner 32 may supply corresponding one of the lead-out lines CNL with the selection pulse Pw having a polygonal waveform similar to the rounded waveform. The polygonal waveform may correspond to the distance from one end of each lead-out line CNL to the node (i.e., the through-hole TH) with the corresponding scanning line WSL. The level of variation in the polygonal waveform may be increased with an increase in the distance. This also suppresses a variation in the signal voltage Vsig ($\Delta$Vpix) applied to the pixels 11 when the signal pulse Ps corresponding to a common image signal Din is applied to the pixels 11, suppressing a display defect such as unevenness in luminance. Accordingly, it is possible to reduce a display defect due to a reduction in the bezel width.

Modification Example F

Figure 15:
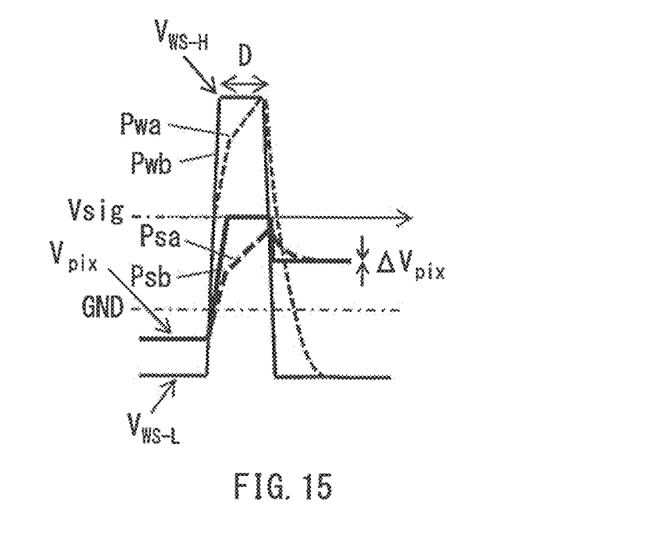
FIG. 15 is an example diagram of a selection pulse and a signal pulse according to one modification of the disclosure.

In any embodiment and modification of the disclosure, the write scanner 32 may supply corresponding one of the lead-out lines CNL with the selection pulse Pw having a pulse width D based on the distance from one end of the corresponding one of the lead-out lines CNL to the corresponding node TH, as illustrated in FIG. 15, for example. The write scanner 32 may decrease the pulse width D with an increase in the distance. In this modification, the write scanner 32 may change the width of the selection pulse Pw instead of the peak value of the selection pulse Pw. This also suppresses a variation in the signal voltage Vsig ($\Delta$Vpix) applied to the pixels 11 when the signal pulse Ps corresponding to the common image signal Din is applied to the pixels 11, suppressing a defect such as unevenness in luminance. Accordingly, it is possible to reduce a display defect due to a reduction in the bezel width.

Further, the write scanner 32 may supply corresponding one of the lead-out lines CNL with the selection pulse Pw having a polygonal waveform that is similar to the rounded waveform, as illustrated in FIG. 15, for example. The polygonal waveform may correspond to the distance from one end of the corresponding one of the lead-out lines CNL to the corresponding node (i.e., the corresponding through-hole TH). For example, the write scanner 32 may supply corresponding one of the lead-out lines CNL with the selection pulse Pw having the polygonal waveform based on the distance, after increasing a level of variation in the polygonal waveform with the increase in the distance. This also suppresses a variation in the signal voltage Vsig ($\Delta$Vpix) applied to the pixels 11 when the signal pulse Ps corresponding to a common image signal Din is applied to the pixels 11, suppressing a display defect such as unevenness in luminance. Accordingly, it is possible to reduce a display defect due to a reduction in the bezel width.

3. Application Examples

Application Example 1

Described below is an application example of the display apparatus 1 according to any embodiment or modification of the disclosure. The display apparatus 1 is applicable to a variety of display apparatuses of electronic apparatuses that display images or pictures based on external or internal image signals. Non-limiting examples of the electronic apparatuses may include televisions, digital cameras, notebook personal computers, sheet-like personal computers, portable terminal devices such as mobile phones, and video cameras.

Figure 16:
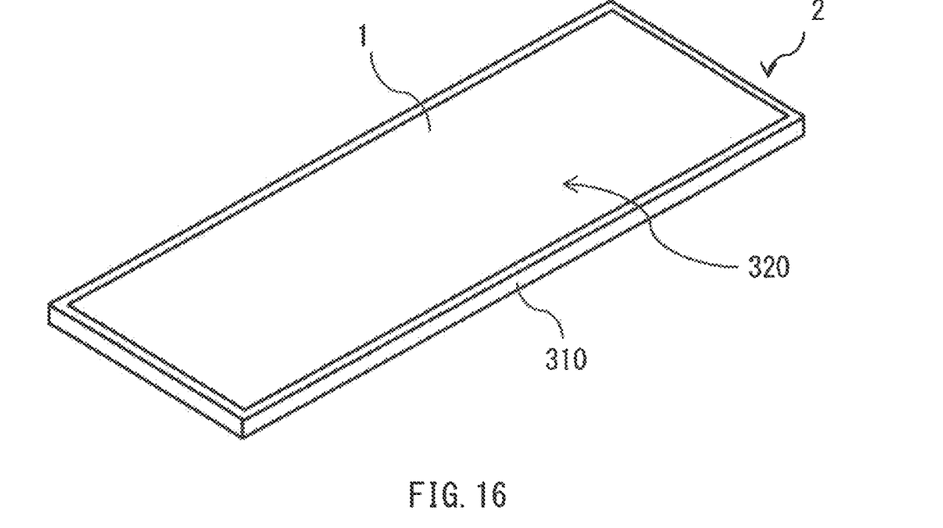
FIG. 16 is a perspective view of an electronic apparatus provided with a display apparatus according to one embodiment of the disclosure and having an example external appearance.

FIG. 16 is a perspective view of an electronic apparatus 2 having an example external appearance according to an application example. The electronic apparatus 2 may be, for example, a sheet-like personal computer including a body 310 having a display surface 320 on a main face. The display apparatus 1 according to any embodiment or modification of the disclosure may be provided on the display surface 320 of the electronic apparatus 2. The display apparatus 1 may be disposed with the display panel 10 facing outward. The electronic apparatus 2 of the application example that includes the display apparatus 1 according to any embodiment or modification of the disclosure on the display surface 320 is less likely to cause a display defect.

Application Example 2

Described below is another application example of the display apparatus 1 according to any embodiment or any modification of the disclosure. The display apparatus 1 is applicable to a variety of light sources in illumination apparatuses for table lightings, floor lightings, and room lightings.

Figure 17:
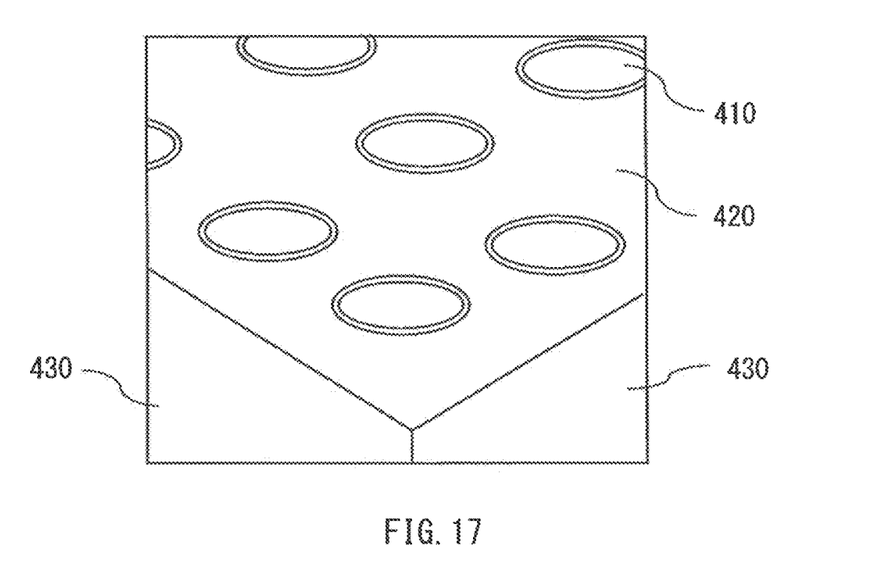
FIG. 17 is a schematic view of an illumination apparatus provided with a display apparatus according to one embodiment of the disclosure and having an example external appearance.

FIG. 17 is a schematic view of an illumination apparatus for a room lighting provided with the display apparatus 1 according to any embodiment or modification and having an example external appearance. The illumination apparatus may include, for example, illuminating sections 410 each including at least one the display apparatus 1. An appropriate number of the illuminating sections 410 are disposed at appropriate intervals on a ceiling 420. Note that the illuminating sections 410 may be installed on any place, such as a wall 430 or a non-illustrated floor, other than the ceiling 420, depending on the intended use.

The illumination apparatus may perform illumination with light emitted from the display apparatus 1 according to any embodiment or modification of the disclosure. Accordingly, the illumination apparatus is less likely to cause a display defect.

Although the disclosure is described with reference to the example embodiments, modifications, and application examples hereinabove, these embodiments are not to be construed as limiting the scope of the disclosure and may be modified in a wide variety of ways. It should be appreciated that the effects described herein are mere examples. Effects of an embodiment of the disclosure are not limited to those described herein. The disclosure may further include any effects other than those described herein.

Furthermore, the technology encompasses any possible combination of some or all of the various embodiments and the modifications described herein and incorporated herein.

It is possible to achieve at least the following configurations from the above-described example embodiments of the technology.

(1) A display apparatus including:
a display panel; and
a driving circuit configured to drive the display panel,
the display panel including:
a plurality of pixels disposed in matrix;
a plurality of signal lines extending in a column direction;
a plurality of scanning lines extending in a row direction; and
a plurality of lead-out lines extending in the column direction, each of the lead-out lines intersecting with corresponding one of the scanning lines at an intersection and being electrically coupled to the corresponding one of the scanning lines at a node, the node being disposed at the intersection or in a region surrounding the intersection,
the driving circuit being configured to supply corresponding one of the signal lines with a signal pulse corresponding to an image signal, and supply corresponding one of the lead-out lines with a selection pulse having a peak value based on a distance from one end of the corresponding one of the lead-out lines to the corresponding node, after increasing the peak value with an increase in the distance, the selection pulse being directed to selection of the pixels.

(2) The display apparatus according to (1), in which the driving circuit supplies the corresponding one of the lead-out lines with the selection pulse having a rounded waveform based on the distance, after increasing the rounding of the selection pulse with the increase in the distance.

(3) The display apparatus according to (1), in which the driving circuit supplies the corresponding one of the lead-out lines with the selection pulse having a polygonal waveform based on the distance, after increasing a level of variation in the polygonal waveform with the increase in the distance, the polygonal waveform being similar to the rounded waveform.

(4) The display apparatus according to any one of (1) to (3), in which the corresponding one of the lead-out lines is disposed closer to the corresponding one of the signal lines than any other one of the lead-out lines.

(5) The display apparatus according to any one of (1) to (4), further including a plurality of capacitors each coupled to the corresponding one of the lead-out lines, in which the capacitors each have a capacitance that is increased with the increase in the corresponding distance.

(6) The display apparatus according to any one of (1) to (5), in which the display panel further includes a light-transmissive substrate that supports the pixels, the signal lines, the scanning lines, and the lead-out lines.

(7) The display apparatus according to any one of (1) to (5), in which the display panel further includes a flexible substrate that supports the pixels, the signal lines, the scanning lines, and the lead-out lines.

(8) The display apparatus according to any one of (1) to (5), in which
the display panel further includes a rectangular substrate that supports the pixels, the signal lines, the scanning lines, and the lead-out lines,
the substrate has a first outer edge region extending along a first side in the row direction and three second outer edge regions extending along respective second sides,
a width of the first outer edge region is greater than a width of each of the second outer edge regions.

(9) The display apparatus according to (8), in which the display panel further includes a flexible printed circuit board, the flexible printed circuit board being disposed adjacent to the first side and electrically coupling the signal lines and the lead-out lines to an external circuit or electrically coupling the driving circuit to the external circuit.

(10) A display apparatus including:
a display panel; and
a driving circuit configured to drive the display panel,
the display panel including:
a plurality of pixels disposed in matrix;
a plurality of signal lines extending in a column direction;
a plurality of scanning lines extending in a row direction; and
a plurality of lead-out lines extending in the column direction, each of the lead-out lines intersecting with corresponding one of the scanning lines at an intersection and being electrically coupled to the corresponding one of the scanning lines at a node, the node being disposed at the intersection or in a region surrounding the intersection,
the driving circuit being configured to supply corresponding one of the signal lines with a signal pulse corresponding to an image signal, and supply corresponding one of the lead-out lines with a selection pulse having a pulse width based on a distance from one end of the corresponding one of the lead-out lines to the corresponding node, after decreasing the pulse width with an increase in the distance, the selection pulse being directed to selection of the pixels.

(11) A method of driving a display panel, the method including:
preparing a display panel that includes a plurality of pixels disposed in matrix, a plurality of signal lines extending in a column direction, a plurality of scanning lines extending in a row direction, and a plurality of lead-out lines extending in the column direction, each of the lead-out lines intersecting with corresponding one of the scanning lines at an intersection and being electrically coupled to the corresponding one of the scanning lines at a node, the node being disposed at the intersection or in a region surrounding the intersection;
supplying corresponding one of the signal lines with a signal pulse corresponding to an image signal; and
supplying corresponding one of the lead-out lines with a selection pulse having a peak value based on a distance from one end of the corresponding one of the lead-out lines to the corresponding node, after increasing the peak value with an increase in the distance, the selection pulse being directed to selection of the pixels.

(12) A method of driving a display panel, the method including:
preparing a display panel that includes a plurality of pixels disposed in matrix, a plurality of signal lines extending in a column direction, a plurality of scanning lines extending in a row direction, and a plurality of lead-out lines extending in the column direction, each of the lead-out lines intersecting with corresponding one of the scanning lines at an intersection and being electrically coupled to the corresponding one of the scanning lines at a node, the node being disposed at the intersection or in a region surrounding the intersection;
supplying corresponding one of the signal lines with a signal pulse corresponding to an image signal; and
supplying corresponding one of the lead-out lines with a selection pulse having a pulse width based on a distance from one end of the corresponding one of the lead-out lines to the corresponding node, after decreasing the pulse width with an increase in the distance, the selection pulse being directed to selection of the pixels.

(13) A display apparatus including:
a display panel; and
a driving circuit configured to drive the display panel, the display panel including:
a plurality of pixels disposed in matrix;
a plurality of signal lines extending in a column direction;
a plurality of scanning lines extending in a row direction;
a plurality of lead-out lines extending in the column direction, each of the lead-out lines intersecting with corresponding one of the scanning lines at an intersection and being electrically coupled to the corresponding one of the scanning lines at a node, the node being disposed at the intersection or in a region surrounding the intersection; and
a plurality of capacitors each coupled to the corresponding one of the lead-out lines, the capacitors each having a capacitance that is increased with the increase in the corresponding distance.

In the display apparatus and the method of driving the display panel according to any embodiment of the disclosure, the signal pulse corresponding to the image signal is supplied to corresponding one of the signal lines, and the selection pulse directed to selection of the pixels is supplied to corresponding one of the lead-out lines. The selection pulse supplied to the corresponding one of the lead-out lines has the peak value based on the distance from one end of the corresponding one of the lead-out lines to the node with the corresponding one of the scanning lines. The peak value of the selection pulse is increased with the increase in the distance. This suppresses a variation in the signal voltage applied to the pixels 11 when the signal pulse corresponding to a common image signal Din is applied to the pixels.

The display apparatus and the method of driving the display panel according to any embodiment of the disclosure suppress a variation in the signal voltage Vsig (ΔVpix) applied to the pixels 11 when the signal pulse Ps corresponding to a common image signal Din is applied to the pixels 11, suppressing a display defect, such as unevenness in luminance. Accordingly, it is possible to reduce a display defect due to a reduction in the bezel width.

Effects of the disclosure are not limited to those described hereinabove, and may be any effect described herein.

Although the disclosure has been described in terms of example embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc. are used to distinguish one element from another. Moreover, no element or component in this disclosure is intended to be dedicated to the public regardless of whether the element or component is explicitly recited in the following claims.

What is claimed is:

1. A display apparatus comprising:
a display panel; and
a driving circuit configured to drive the display panel, the display panel including:
a plurality of pixels disposed in matrix;
a plurality of signal lines extending in a column direction;
a plurality of scanning lines extending in a row direction; and
a plurality of lead-out lines extending in the column direction, each of the lead-out lines intersecting with corresponding one of the scanning lines at an intersection and being electrically coupled to the corresponding one of the scanning lines at a node, the node being disposed at the intersection or in a region surrounding the intersection,
the driving circuit being configured to supply a corresponding one of the signal lines with a signal pulse corresponding to an image signal, and supply a corresponding one of the lead-out lines with a selection pulse having a peak value based on a distance from one end of the corresponding one of the lead-out lines to the corresponding node, after increasing the peak value with an increase in the distance, the selection pulse being directed to selection of the pixels.

2. The display apparatus according to claim 1, wherein the driving circuit supplies the corresponding one of the lead-out lines with the selection pulse having a rounded waveform variation based on the distance, after increasing the rounding of the selection pulse with the increase in the distance.

3. The display apparatus according to claim 2 wherein the driving circuit supplies the corresponding one of the lead-out lines with the selection pulse having a polygonal waveform based on the distance, after increasing a level of variation in the polygonal waveform with the increase in the distance, the polygonal waveform variation being similar to the rounded waveform variation.

4. The display apparatus according to claim 1, wherein the corresponding one of the lead-out lines is disposed closer to the corresponding one of the signal lines than any other one of the lead-out lines.

5. The display apparatus according to claim 1, further comprising a plurality of capacitors each coupled to the corresponding one of the lead-out lines, wherein the capacitors each have a capacitance that is increased with the increase in the corresponding distance.

6. The display apparatus according to claim 1, wherein the display panel further includes a light-transmissive substrate that supports the pixels, the signal lines, the scanning lines, and the lead-out lines.

7. The display apparatus according to claim 1, wherein the display panel further includes a flexible substrate that supports the pixels, the signal lines, the scanning lines, and the lead-out lines.

8. The display apparatus according to claim 1, wherein
the display panel further includes a rectangular substrate that supports the pixels, the signal lines, the scanning lines, and the lead-out lines,
the substrate has a first outer edge region extending along a first side in the row direction and three second outer edge regions extending along respective second sides,
a width of the first outer edge region is greater than a width of each of the second outer edge regions.

9. The display apparatus according to claim 8, wherein the display panel further includes a flexible printed circuit board, the flexible printed circuit board being disposed adjacent to the first side and electrically coupling the signal lines and the lead-out lines to an external circuit or electrically coupling the driving circuit to the external circuit.

10. A method of driving a display panel, the method comprising:
preparing a display panel that includes a plurality of pixels disposed in a matrix, a plurality of signal lines extending in a column direction, a plurality of scanning lines extending in a row direction, and a plurality of lead-out lines extending in the column direction, each of the lead-out lines intersecting with a corresponding one of the scanning lines at an intersection and being electrically coupled to the corresponding one of the scanning lines at a node, the node being disposed at the intersection or in a region surrounding the intersection;
supplying a corresponding one of the signal lines with a signal pulse corresponding to an image signal; and
supplying a corresponding one of the lead-out lines with a selection pulse having a peak value based on a distance from one end of the corresponding one of the lead-out lines to the corresponding node, after increasing the peak value with an increase in the distance, the selection pulse being directed to selection of the pixels.

11. A method of driving a display panel, the method comprising:
preparing a display panel that includes a plurality of pixels disposed in a matrix, a plurality of signal lines extending in a column direction, a plurality of scanning lines extending in a row direction, and a plurality of lead-out lines extending in the column direction, each of the lead-out lines intersecting with a corresponding one of the scanning lines at an intersection and being electrically coupled to the corresponding one of the scanning lines at a node, the node being disposed at the intersection or in a region surrounding the intersection;
supplying a corresponding one of the signal lines with a signal pulse corresponding to an image signal; and
supplying a corresponding one of the lead-out lines with a selection pulse having a pulse width based on a distance from one end of the corresponding one of the lead-out lines to the corresponding node, after decreasing the pulse width with an increase in the distance, the selection pulse being directed to selection of the pixels.

* * * * *